United States Patent
Canal et al.

(10) Patent No.: US 10,630,288 B2
(45) Date of Patent: Apr. 21, 2020

(54) SWITCH

(71) Applicant: THALES, Courbevoie (FR)

(72) Inventors: Yves Canal, Elancourt (FR); Charlotte Tripon-Canseliet, Paris (FR); Jean Chazelas, Elancourt (FR)

(73) Assignee: THALES, Courbevoie (FR)

( * ) Notice: Subject to any disclaimer, the term of this patent is extended or adjusted under 35 U.S.C. 154(b) by 35 days.

(21) Appl. No.: 16/172,440

(22) Filed: Oct. 26, 2018

(65) Prior Publication Data
US 2019/0131968 A1    May 2, 2019

(30) Foreign Application Priority Data

Oct. 30, 2017 (FR) .................................... 17 01129

(51) Int. Cl.
| | |
|---|---|
| H01L 31/09 | (2006.01) |
| H01L 31/08 | (2006.01) |
| H03K 17/94 | (2006.01) |
| H01L 31/0224 | (2006.01) |
| H03K 17/78 | (2006.01) |
| H04B 1/44 | (2006.01) |
| H04L 5/00 | (2006.01) |

(52) U.S. Cl.
CPC ......... *H03K 17/94* (2013.01); *H01L 31/0224* (2013.01); *H01L 31/08* (2013.01); *H01L 31/09* (2013.01); *H03K 17/78* (2013.01); *H04B 1/44* (2013.01); *H04L 5/00* (2013.01)

(58) Field of Classification Search
CPC .......... G02B 6/26; H03K 17/62; H01L 31/09; H01L 31/08
USPC ........................................................... 385/16
See application file for complete search history.

(56) References Cited

U.S. PATENT DOCUMENTS

| | | | |
|---|---|---|---|
| 9,431,564 B2* | 8/2016 | Davies | H03K 17/78 |
| 9,548,413 B2* | 1/2017 | Tripon-Canseliet | H01L 31/09 |
| 2002/0113759 A1* | 8/2002 | Levine | H01P 1/15 345/55 |

FOREIGN PATENT DOCUMENTS

FR       3 000 327 A1     6/2014

* cited by examiner

*Primary Examiner* — Dean O Takaoka
(74) *Attorney, Agent, or Firm* — Baker & Hostetler LLP

(57) ABSTRACT

A switch includes a substrate and a microwave line comprising two tracks produced on the substrate, an active zone of the substrate being bounded by the two conductive tracks and connecting the two tracks. The switch comprises a set of at least one DC line, intended to convey a DC current, the DC line comprising two electrodes that are distant from each other and that are connected by a separation zone of the substrate, the separation zone being able to be made conductive when it is illuminated by the optical control beam so as to establish an electrical contact between the two electrodes, the two electrodes being separated by a separation plane of the DC line, the separation plane passing through the centre O and being perpendicular to the plane of the active zone.

16 Claims, 11 Drawing Sheets

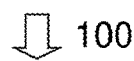
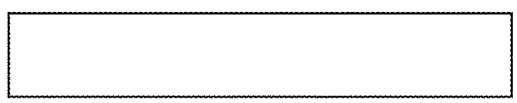
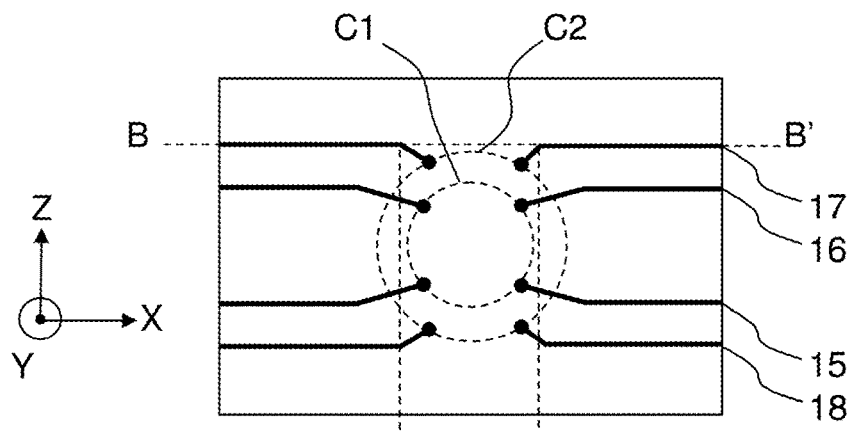
FIG.4a
FIG.4b
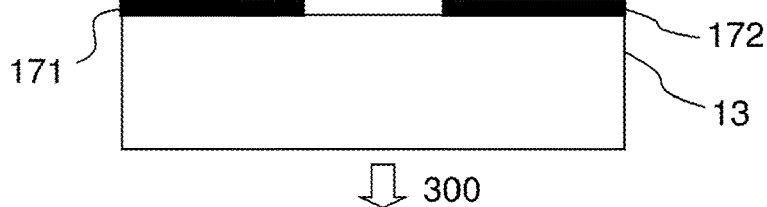
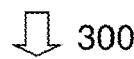
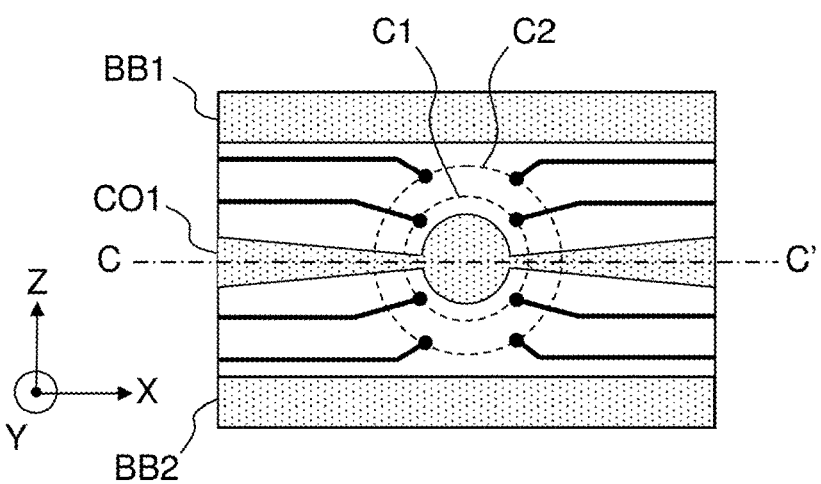
FIG.4c
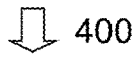

SWITCH

CROSS-REFERENCE TO RELATED APPLICATIONS

This application claims priority to foreign French patent application No. FR 1701129, filed on Oct. 30, 2017, the disclosure of which is incorporated by reference in its entirety.

FIELD OF THE INVENTION

The present invention relates to optically controlled switches of the type comprising a transmission line comprising two line sections that are separated by a gap and that are connected by a photoconductive line-interruption zone, called the active zone, the conductance of which is controlled via a photoelectric effect by means of an optical beam that illuminates this zone. The switch may be in an on, or open, state in which the electrical continuity of the transmission line is assured, when the active zone is illuminated by an optical beam, or in an off, or closed, state in which the electrical continuity of the transmission line is not assured, when the active zone is not illuminated.

BACKGROUND

These switches may, for example, be used as single-pole multi-throw photo-switches, single-pole single-throw photo-switches, photo-transistors, photo-mixers, phase shifters or samplers. In the case of use as a sampler, a microwave transmission line is interrupted by a switch that is controlled by a reference optical signal and that switches between the on and off states at very precise times, defined by a clock, in order to sample a microwave electrical signal injected onto the microwave transmission line.

The invention most particularly applies to the microwave field. It will be recalled that the frequency band of microwave signals is from about a few gigahertz (GHz) to a few hundred GHz. Many applications in the fields of telecommunications and radars use such microwave signals. To perform the aforementioned functions in the microwave field, the switch must have a rapid response time of about one picosecond and a maximum contrast between the open state and the closed state.

It has recently been demonstrated that the performance of single-pole signal-throw microwave photo-switches may be increased (noise factor in particular decreased) by decreasing the dimensions of the line interruptions to dimensions of the order of magnitude of a micron, which makes the delivery of a sufficient amount of optical energy to the active zone of the switch more difficult. However, if the amount of light energy reaching the active zone of the switch is insufficient, the latter will have unacceptable ON/OFF switching times, and a low contrast between the 2 states of the switch. It is therefore sought to achieve maximum optical coupling between the optical control beam and the switch, i.e. to deliver the highest possible proportion of the emitted optical beam to the active zone.

Switching devices thus conventionally comprise optical components allowing the optical control beam to be conveyed to the active zone of the switch. These conveying means are interposed, on the path of the optical beam, between the optical source (a laser in general, for example a laser diode) and the active zone. These conveying means conventionally comprise a single-mode optical fibre allowing the optical control beam to be guided, and a convergent optical lens intended to focus the optical beam on the active zone. The optical components allow the optical control power to be optimized by focusing a maximum of light onto the active zone. For an optical beam of about one micron in size, and for an active zone of the same size, it is necessary to position the spot, formed by the optical beam on the optical component, with respect to the centre of the active zone of the switch with a precision of 0.1 microns.

However, it is not possible to adhesively bond these optical components to the switch. Specifically, such a contact induces a modification of the electromagnetic field leading to a modification of the transfer function of the microwave line of the switch. It is therefore necessary to preserve a sufficient distance, corresponding to the focal length of the lens, between the lens and the active zone, this making it more difficult to position the conveying means with respect to the active zone.

It is known to place a lensed optical fibre (optical fibre equipped with a convergent lens securely fastened to one end of the optical fibre) in a trench of V-shaped profile produced in a silicon substrate, facing an optoelectronic component comprising the microwave transmission line, which is also fastened to the substrate. The properties of the V (dimensions, inclination) are very precise since they are defined by the crystal properties of the silicon. This precision allows the precision in the desired relative position between the end of the lensed optical fibre and the active zone, in the plane of the active zone, to be obtained. The optimal position of the end of the optical fibre, along an axis perpendicular to the plane of the active zone, is obtained by measuring a maximum transmission coefficient of a signal conveyed by the microwave line through the switching device. The optical fibre is then definitively fastened to the carrier in the optimal position.

Another solution consists in adding a tool allowing the relative position of the optical fibre and the active zone to be adjusted, the optimal position being obtained by measuring the transmission coefficient on the microwave line through the switch, the tool allowing the optical fibre to be held for a sufficient time in the optimal position to allow the optical fibre to be fastened in this position with respect to the active zone.

However, control of the optimal position via the transmission coefficient is dependent on the frequency of the signal transmitted over the microwave transmission line. This measurement requires a microwave testbed equipped with a microwave-signal generator and a microwave-signal receiver to be provided.

Moreover, current optical devices deliver a focused beam of size larger than the active zone of the device in the plane of the active zone. The diameter of the beam is generally of the order of 2 microns in the active zone. The transmission maximum does not allow a sufficient precision to be obtained in relative position either in the plane of the active zone, or in the direction perpendicular to this plane.

Moreover, assuming that the relative position of the optical elements (for example an optical fibre equipped with a lens or lensed optical fibre) with respect to the active zone is unknown before adjustment, no indicator other than the maximum transmitted signal can be used to make the alignment between these two elements rapidly converge. There is then a risk of optical components, the lensed optical fibre for example, being damaged by contact with the device.

SUMMARY OF THE INVENTION

One aim of the invention is to limit at least one of the aforementioned drawbacks.

To this end, the invention relates to a switch comprising a semiconductor substrate and a microwave line comprising two conductive tracks produced on the substrate, the two conductive tracks being separated by a gap assuring an electrical isolation between the two conductive tracks, an active zone of the substrate being bounded by the two conductive tracks and connecting the two conductive tracks, the active zone being planar, defining a plane of the active zone, and having a centre O, the substrate being able to be made locally conductive when the active zone is illuminated by an optical control beam so as to establish an electrical contact between the two tracks of the microwave line. According to the invention, the switch furthermore comprises a set of at least one line, called the DC line, intended to convey a DC current, the DC line comprising two electrodes that are distant from each other so that an electrical isolation is assured between the two electrodes, the electrodes being connected by a separation zone of the substrate, the separation zone being able to be made conductive when it is illuminated by the optical control beam so as to establish an electrical contact between the two electrodes, the two electrodes being separated by a separation plane of the DC line, the separation plane passing through the centre O and perpendicular to the plane of the active zone.

Advantageously, the switch comprises at least one of the features below implemented individually or in combination:

the two electrodes each comprise a terminal called the central terminal of the DC line, the central terminals of the two electrodes of the DC line being placed facing each other on an alignment straight line of the DC line, the alignment straight line of the DC line is perpendicular to the separation plane of the DC line symmetrically with respect to the separation plane of the DC line, the set comprises two DC lines the respective alignment straight lines of which are perpendicular to each other, the set comprises a plurality of DC lines, two DC lines of which have the same separation plane, the central terminals of each of the two DC lines having the same separation plane being placed symmetrically with respect to the separation plane on an alignment straight line of the DC line perpendicular to the separation plane, the alignment straight lines of the two DC lines being placed symmetrically with respect to another plane passing through the centre, perpendicular to the plane of the active zone and to the separation plane, the set comprises a first subset of at least one DC line and a second subset of at least one DC line, the central terminals of the electrodes of the DC lines of the first subset and second subset being placed on concentric circles the centre of which is located on an axis perpendicular to the plane of the active zone and passing through the centre O, the separation plane of the DC line of the first subset is the separation plane of the DC line of the second subset, the two central terminals of the DC line of the first subset being placed on the other side of another plane passing through the centre O, perpendicular to the plane of the active zone and to the separation plane with respect to the central terminals of the DC line of the second subset, the alignment straight line of at least one DC line passes through an axis perpendicular to the plane of the active zone and passing through the centre O, the active zone and the separation zone are made from different materials, the active zone comprises carriers of lifetime lower than a lifetime of the carriers of the separation zone.

The invention also relates to a process for fabricating a switch according to the invention. The process comprises the steps of placing the conductive tracks on the substrate so that they are separated by the gap, and so that they bound and are connected by the active zone, and placing the electrodes of the DC line on the substrate so that they are distant from each other so that an electrical isolation is assured between the two electrodes and so that they are connected by the separation zone of the substrate, and separated by the separation plane.

The invention also relates to a switching device comprising a switch according to the invention and a source generating the optical control beam and/or conveying means comprising at least one optical component allowing the optical control beam to be conveyed to the active zone.

Advantageously, the switching device comprises an actuating device allowing a position of the optical source and/or of at least one part of at least one optical component of the conveying means to be modified with respect to the active zone.

Advantageously, the switching device comprises at least one sensor allowing an electrical property of the separation zone between central terminals of the two electrodes of the DC line to be measured, the adjusting device being able to adjust a position of the optical source and/or of at least one part of at least one optical component of the conveying means with respect to the active zone on the basis of at least one measurement of the electrical property.

Advantageously, the switching device is configured to implement an aligning step when a condition of implementation of the aligning step is met, the switching device being configured to implement the following steps during the implementation of the aligning step:

measuring the electrical property of the separation zone between the central terminals of the DC line by means of the sensor, adjusting the position of the source and/or of at least one part of at least one optical component of the conveying means relatively to the active zone on the basis of a measurement of the electrical property issued from the sensor, by means of the adjusting device.

The invention also relates to a method for aligning the source and/or at least one part of at least one optical component of the conveying means with respect to the active zone of a switching device according to the invention, said method comprising the following steps:

measuring the electrical property of the separation zone between the central terminals of the DC line, adjusting the position of the source and/or of at least one part of at least one optical component of the conveying means relatively to the active zone on the basis of said measurement.

BRIEF DESCRIPTION OF THE DRAWINGS

Other features, aims and advantages of the present invention will become apparent on reading the following detailed description with reference to the appended drawings, which are given by way of nonlimiting example and in which:

FIGS. 4a to 4c schematically illustrate the steps of the process for fabricating the switching device according to the invention;

From one figure to the next elements that are the same have been referenced with the same references.

DETAILED DESCRIPTION

Figure 1:
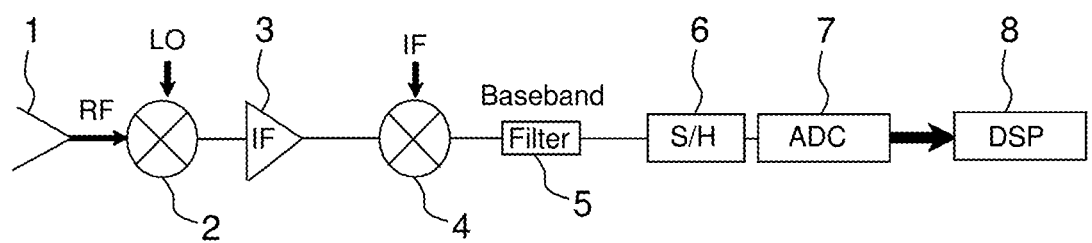
FIG. 1 is a schematic illustration of a reception chain.

FIG. 1 schematically illustrates a conventional reception chain used in many current systems. Because of the intrinsic limitations of the passband accessible by analogue-digital converters that are in the process of being developed, microwave reception chains require complex and expensive transposition functions for which there are no alternatives. Thus, the reception chain of FIG. 1 includes at the output of the antenna 1 for receiving the microwave signal a first mixer 2 that downshifts the frequency of the signal to an intermediate frequency band. A second mixer 4 transposes the amplified signal 3 to baseband where it is sampled at high frequency by a sample-and-hold unit 6 after filtering 5 for example. The sampled signal is digitally converted by a converter 7, the digital signal being taken into account by processing means 8.

Future systems, even more than current systems, will require receivers that operate either at very high frequency, several tens of GHz, or with a very wide instantaneous passband, 20 GHz for example. Such receivers require very-high-performance switching functions. Optically controlled switching devices capable of switching very rapidly are able to be employed at these operating frequencies provided their performance in terms of ON/OFF contrast level is sufficient, for example higher than 50 dB. It is also necessary for their performance in terms of required optical power and insertion losses to be sufficient in order to allow an operation that is acceptable in terms of power consumption to be achieved. Such switching devices provide an elementary switching function for components of the reception chain, such as sample-and-hold units for example. They may also be used to produce mixers, phase shifters and other of the aforementioned components requiring an effective ultra-rapid elementary switching function.

The invention relates to an optoelectronic device of the optically-controlled-switching-device type and to a switch comprising such a switching device.

Figure 2A:
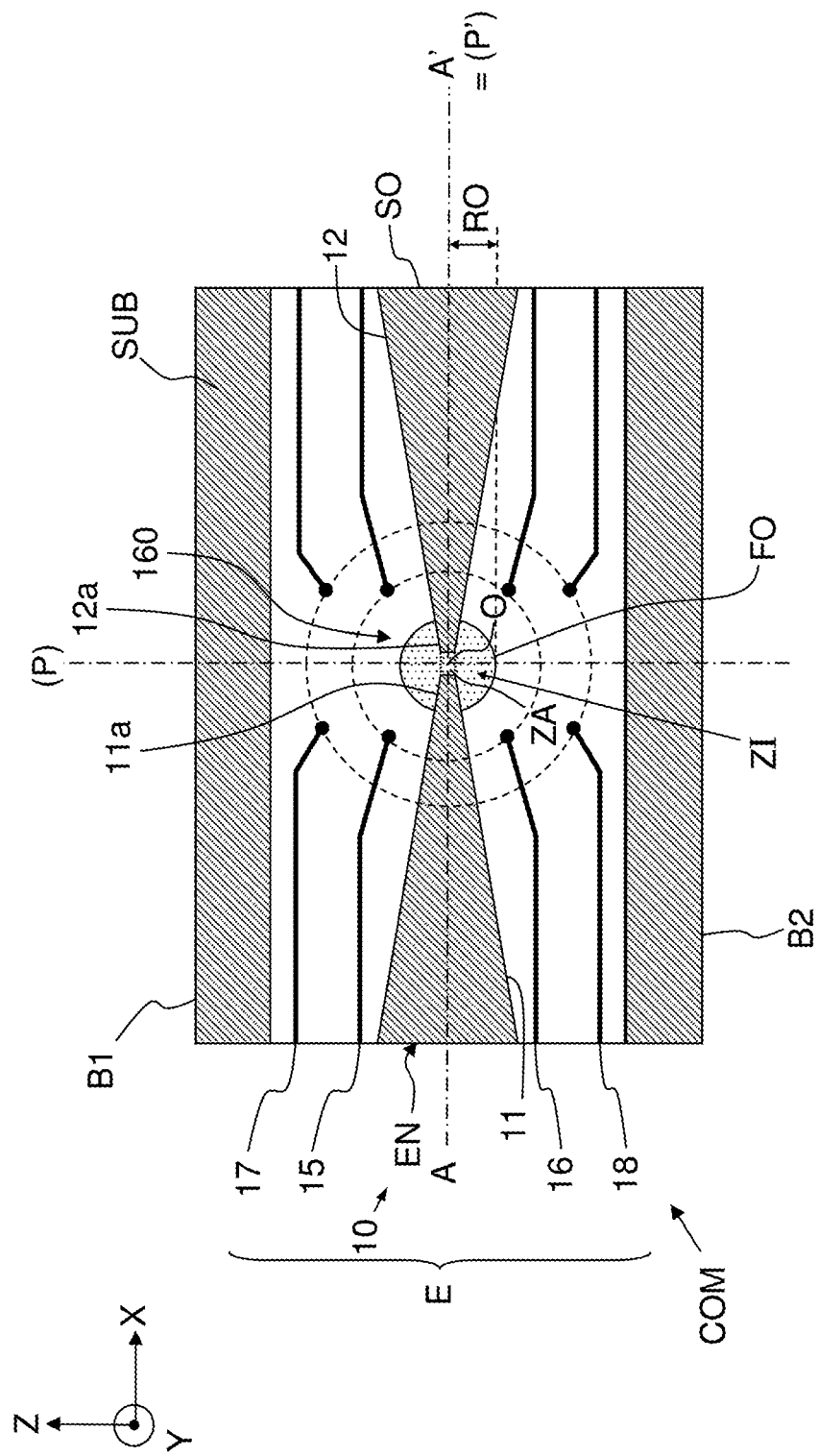
FIGS. 2a and 2b schematically illustrate seen from above (FIG. 2a) and in cross section in the sectional plane AA' of FIG. 2a (FIG. 2b), the switch according to the invention, in which the DC lines are not referenced for greater clarity.
Figure 2B:
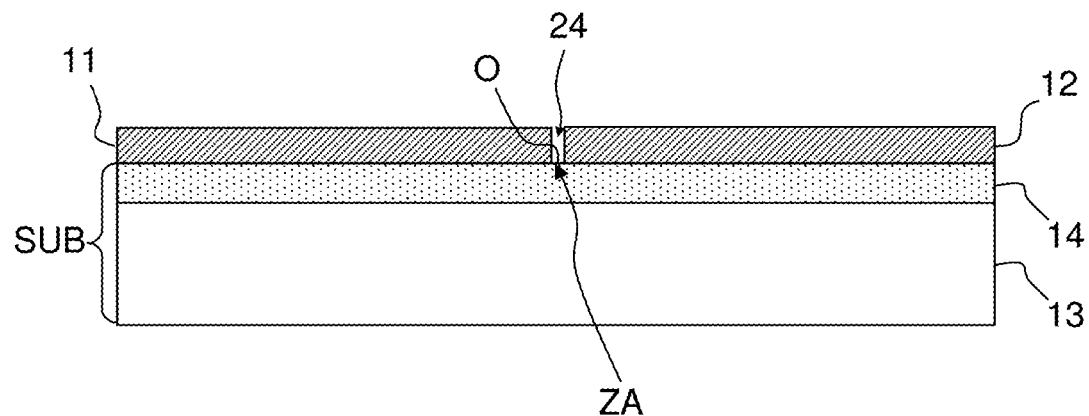
Figure 3B:
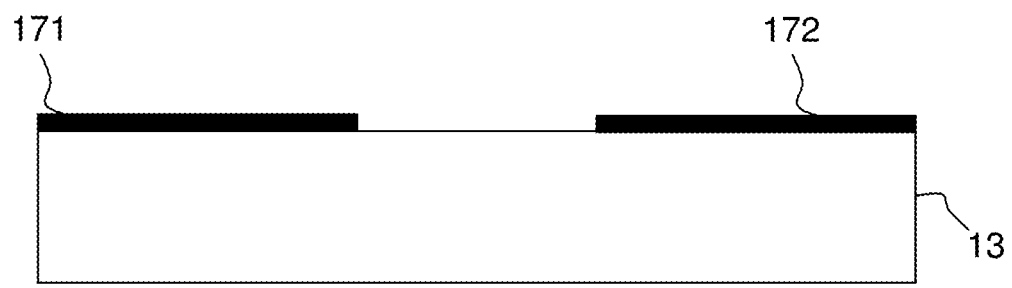
FIGS. 3a and 3b schematically illustrate the switch according to the invention equipped with measuring means seen from above (FIG. 3a) and in cross section in the sectional plane BB' of FIG. 3a (FIG. 3b)
Figure 3A:
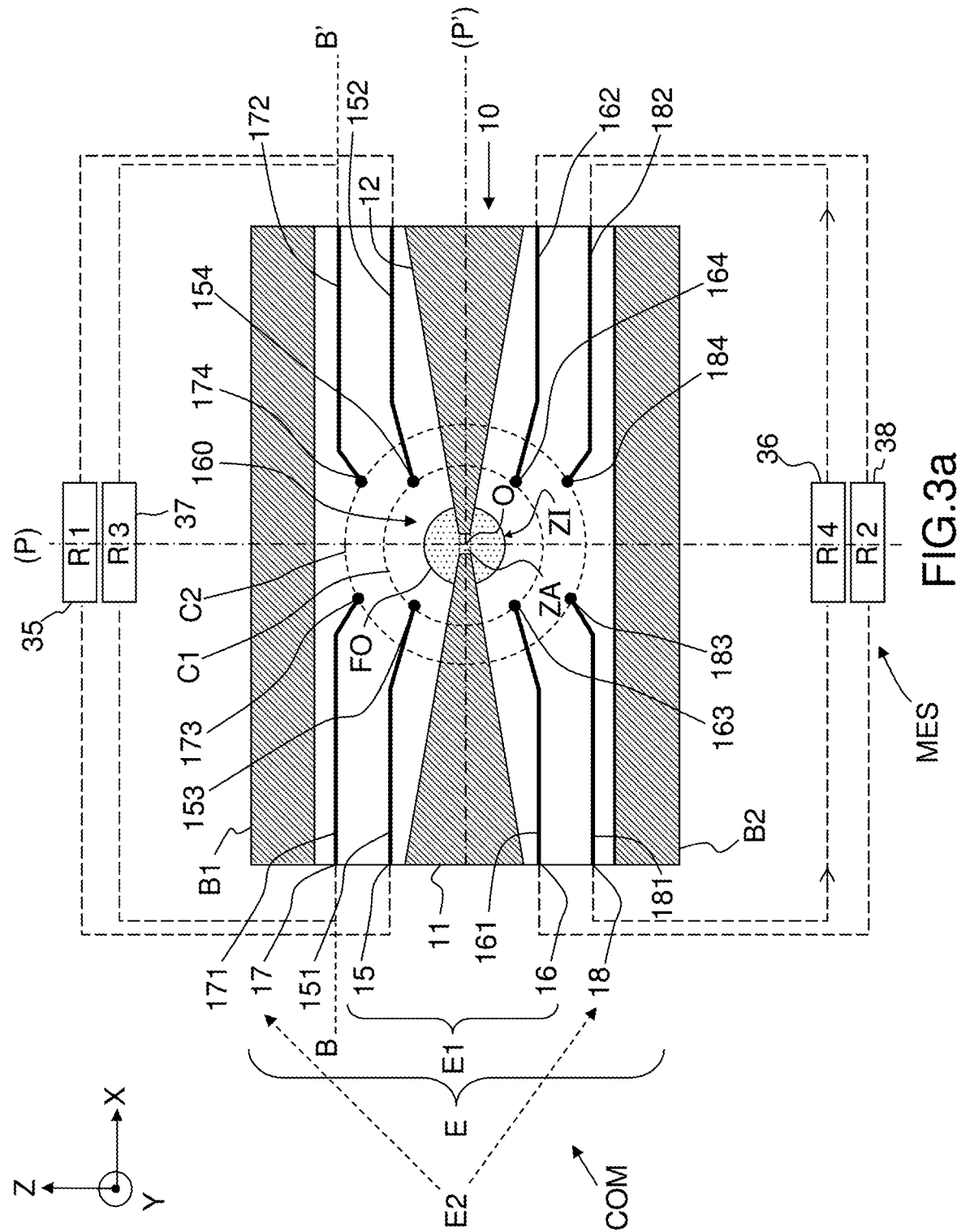

FIGS. 2a and 2b and 3a and 3b schematically show seen from above (2a and 3a) and in cross section in the sectional plane AA' of FIG. 2a (FIG. 2b) and in the sectional plane BB' of FIG. 3a (FIG. 3b), an example of a switch COM according to the invention, not all the references appearing in these figures for greater clarity. The switch COM of FIG. 3a is equipped with measuring means.

The switch COM comprises a transmission line 10 comprising two conductive tracks 11 and 12 placed on a substrate SUB. These tracks 11 and 12 are distant from each other and separated by a space, also called the gap 24, that is not metallized so as to assure an electrical isolation between the two conductive tracks 11 and 12. The two tracks bound an active zone ZA of the substantially planar substrate, defining a plane called the active zone (x, y). The active zone ZA has a centre O. The two conductive tracks 11 and 12 bound the active zone ZA that connects these two tracks. An electrical contact between the two conductive tracks 11 and 12 is able to be achieved by illuminating the active zone ZA by means of an optical control beam FO of preset wavelength. The substrate SUB is then made electrically conductive in the illuminated zone by injection of carriers in the illuminated zone. The two tracks 11 and 12 are electrically isolated in the absence of illumination of the active zone ZA by the optical control beam FO.

The y-axis is perpendicular to the x, z plane of the active zone ZA.

The transmission line 10 also comprises conductive strips B1, B2 placed on each side of the conductive tracks 11, 12, and connected to a ground potential so as to thus form ground planes. The switch COM shown in FIGS. 2a to 3b is of coplanar type.

In order to perform the switching function the active zone ZA is irradiated with energy by means of an optical control beam FO (shown in FIG. 6b) of preset wavelength such that the beam FO makes the substrate SUB locally conductive between the two conductive tracks 11, 12, and such that an electrical continuity is established between the two tracks 11 and 12, corresponding to the on state of the switch COM. A signal injected into one of the two tracks of the transmission line is then collected by the other track. In contrast, if the active zone ZA ceases to be illuminated, the substrate SUB ceases to be conductive between the two tracks 11 and 12 and the electrical continuity is interrupted between the two tracks 11 and 12, the switch COM then being in the off state. A signal injected into one of the two tracks 11, 12 of the transmission line 10 is then not collected by the other track.

The zone of the switch COM illuminated by the optical control beam FO is called the interaction zone ZI in the rest of the text. It encompasses the active zone ZA when the switch is in the on state.

The semiconductor substrate SUB for example comprises at least two layers. A first layer 13 serves as a carrier. In order to obtain very short response times, this first layer 13 advantageously has on its surface a second semiconductor layer 14 made of a material comprising carriers having carrier lifetimes shorter than the carriers of the first layer 13. The tracks 11, 12 are deposited on the second layer 14. The first layer 13 is for example made of semi-insulating gallium arsenide, denoted SI GaAs, and the second layer 14 is for example made of low-temperature (LT) epitaxial gallium arsenide (LT GaAs). The second layer 14 may moreover be doped.

As a variant, the first layer 13 and the second layer 14 may be made from semiconductors different from SI GaAs and GaAs, such as for example silicon Si, InP, etc.

In the nonlimiting example of FIGS. 2a and 3b, the active zone ZA is a portion of a side, called the front side, of the substrate SUB. The active zone ZA is not metallized and is located facing the gap 24.

As a variant, the configuration of the switch is of microstrip type, i.e. there is no ground plane on each side of the conductive tracks 11, 12 but a ground plane located on the back side of the substrate 13, 14. The back side of the substrate 13, 14 is the side of this substrate 13 that is opposite the conductive tracks 11, 12.

The invention is applicable to the microwave field. The transmission line 10 is configured to allow a microwave signal to be transmitted from an input port EN to the output port SO of the switching device. To this end, the shapes and dimensions of the tracks 11 and 12 and the spacing between the tracks 11 and 12 and the position of the conductive strips B1 and B2 are defined so that the input and output impedances of the microwave line of the switch in the on state are matched to the characteristic line impedance of standard microwave lines, i.e. 50 ohms or 75 ohms. The input and output impedances of the device in the on state are in practice comprised between 50 ohms and 75 ohms, as in conventional switches.

The conductive tracks 11 and 12 may advantageously, but not necessarily, have a particular profile such that the input and output impedances of the switch are mismatched to the characteristic impedance of a microwave line when the switch is in the off state. Thus, the off state contrasts from the on state in increased transmission and insertion losses, is added to the highly resistive impedance of the interaction zone. The gap is then dimensioned lengthwise and widthwise to obtain this effect, as described in patent application FR 3000327. To this end, starting from the input and output ports EN and SO, the tracks decrease in width up to level with the gap 24 separating these two tracks 11 and 12. Advantageously, the width of the tracks level with the gap (width of the gap) is of the same order of magnitude as the length of the gap. The gap width and length are for example of the order of 0.2 microns. The width of the tracks level with the gap is preferably comprised between 0.1 and 0.5 microns. Furthermore, the length of the gap is preferably between 0.1 and 0.5 microns. During the illumination, the impedance of the active zone ZA passes from a few Mohms, in the off state, to a few tens of ohms in the on state. This impedance then becomes compatible with the access impedance of the tracks, which is chosen to achieve the mismatch in the off state, thus decreasing signal reflections along the device.

According to the invention, as shown in FIG. 3a, the switch comprises, in addition to the transmission line 10, a set E of at least one conductive (able to conduct electricity) line that is called the DC line in the rest of the text, and that is intended to convey a DC signal. The set E comprises four DC lines 15, 16, 17, 18 in the nonlimiting example of the figures. Generally, the set E comprises one or more DC lines.

Each line comprises two electrodes or conductive tracks 151 and 152; 161 and 162; 171 and 172; 181 and 182 that are distant from each other so as to be electrically isolated from each other. The electrodes of the DC lines are formed on a layer of the substrate SUB. The electrodes of each of the DC lines are connected by a separation zone 160 of the photoconductive substrate SUB. An electrical continuity is established between the two electrodes 151 and 152 or 161 and 162 or 171 and 172 or 181 and 182 of a DC line when the separation zone 160 is illuminated by the optical control beam FO from a terminal, called the central terminal, 153, 163, 173 or 183 of the first electrode 151, 161, 171 or 181 to a terminal, called the central terminal, 154, 164, 174 or 184 of the other electrode 152, 162, 172 or 182 of the same line. In this case, the portion of the separation zone 160 that is bounded by the two central terminals of the same DC line is completely illuminated. The DC line is then in an on or closed state. The optical control beam FO generates a current that flows through the DC line. The electrical contact between the two electrodes of a given DC line is broken when the separation zone 160 is no longer illuminated. The DC line is then in an off or open state. Advantageously, the line is suitable for transmitting a microwave signal through the switch.

The two central terminals of a given DC line are located facing each other. They are the terminals of the two electrodes of a given DC line that are closest each other and closest to the centre O.

According to the invention, the two electrodes 151 and 152, 161 and 162, 171 and 172 or 181 and 182 of a given DC measurement line 15, 16, 17 or 18 are separated from each other by a separation plane P passing through the centre O and perpendicular to the plane of the active zone ZA, i.e. to the (x, z) plane.

In other words, the central terminals 153 and 154; 163 and 164; 173 and 174 or 183 and 184 of the two electrodes 151 and 152; 161 and 162; or 171 and 172 of a given DC line 15, 16, 17 or 18 are separated by the separation plane P of the DC line. One of the central terminals of the DC line is located on one side of the separation plane P of the DC line and the other central terminal of the same line is located on the other side of this separation plane P.

In this way, a value of an electrical property of the material forming the separation zone 160 measured between the central terminals of the two electrodes of a given DC line is representative of the illumination of the separation zone between these two terminals. The value of the electrical property is thus representative of the position of the interaction zone ZI with respect to the active zone ZA in the direction right on which are placed the central terminals of the line, i.e. in the x-direction in the nonlimiting embodiment of the figures. By providing a measuring device MES, 30M (shown in FIG. 5) comprising measuring means 35, 36, 37, 38, allowing the value of the electrical property to be measured for at least one line, such as shown by the dashed lines in FIG. 3a, it is possible to use the measurement of the electrical property to control and thus adjust the position of the interaction zone ZI with respect to the active zone ZA in the x-direction. The electrodes of a given DC line are connected to inputs of the measuring means that may be floating inputs or comprise a grounded terminal.

Typically, the electrical property is a resistance. The resistance R1, R2, R3 or R4 of the material of the separation zone 160 measured between the two central terminals of a corresponding given DC line 15, 16, 17 or 18 varies greatly depending on the illumination of this zone. It is lower than or equal to a conduction threshold, of the order of a few ohms in the case of semi-insulating GaAs, for central terminals separated by a distance of about 5 microns, when the separation zone is completely illuminated by the control beam, from one of the central terminals to the other central terminal of the DC line—this zone is then electrically conductive. The resistance of the material of the separation zone, measured between two central terminals of a given line, is higher than or equal to an isolation threshold, of the order of a few Mohms in the case of semi-insulating GaAs, when the separation zone is no longer completely illuminated, or, more generally, when the interaction zone is shifted so as to no longer completely illuminate the portion of the separation zone 160 bounded by the two central terminals of this DC line.

The means 35, 36, 37, 38 for measuring an electrical resistance representative of an illumination of the separation zone 160 between two central terminals of a given DC line for example comprise an ohmmeter 35, 36, 37 or 38 connected to terminals of the DC line as shown in FIG. 3a.

As a variant, it is possible to measure a quantity other than resistance, such as for example a voltage by means of a voltmeter, a current by means of an ammeter, a conductance.

The proposed solution is insensitive to variations in the frequency of the wave conveyed by the microwave transmission line 10. It disrupts the operation of the microwave line little. The measurement of the electrical property may be used to adjust the position of the interaction zone ZI when the switch is in its operating configuration, i.e. when a signal is being transmitted over the microwave line. The proposed solution does not necessarily require a microwave testbed.

The proposed solution allows the duration and complexity of the adjustment of the position of the interaction zone ZI with respect to the active zone ZA and of the focus of the optical beam on the plane of the active zone to be limited with respect to a less-precise adjustment using a value of the transmission coefficient and that leaves doubt in the direction of the correction to be made to the relative position between the lensed optical fibre and the active zone ZA.

The resistance measurements allow the relative position between the interaction zone and the active zone to be controlled with a high precision of better than one micron, thereby allowing the luminous power transmitted to the active zone ZA to be optimized.

The value of the resistance may also be used to control the diameter of the interaction zone ZI, i.e. the focus of the optical control beam. Specifically, the value of the resistance of the separation zone measured between the two central terminals of a DC line is lower than or equal to the conduction threshold when the interaction zone ZI entirely covers the portion of the separation zone bounded by the two central terminals of the DC line. In this configuration, the resistance decreases when the diameter of the interaction zone ZI increases, because the received energy density decreases, and increases when the diameter of the interaction zone decreases, up to the isolation threshold when the interaction zone no longer continuously extends from one to the other of the central terminals of the DC line.

The two central terminals of a given DC line are placed on a straight line called the alignment straight line of the DC line.

Advantageously, the alignment straight line of a DC line is substantially perpendicular to the separation plane of the DC line. In the nonlimiting example of the figures, the central terminals are separated by one and the same separation plane P. Therefore, the various alignment straight lines are substantially parallel to one another. They are parallel to the x-axis in this nonlimiting example. As a variant, all the alignment straight lines are not parallel to one another. In other words, the central terminals of the various DC lines may be separated by different separation planes.

Advantageously, the two central terminals of at least one DC line are placed on an alignment straight line perpendicular to the separation plane P defined for this DC line, symmetrically to each other with respect to this separation plane P. Thus, the device for measuring the resistance of the material forming the separation zone 160, considered between the two central terminals, is simple. In the particular example embodiment of FIGS. 2a to 3b, the central terminals 153 and 154; 163 and 164; 173 and 174 and 183 and 184 of the two electrodes 151 and 152; 161 and 162; 171 and 172 and 181 and 182 of a given DC line 15, 16, 17, and 18 are located on a given concentric circle C1 or C2 the centre of which is located on the same axis perpendicular to the plane of the active zone ZA as the centre O. As a variant, the central terminals of the two electrodes of a given DC line are placed at different distances from the plane P.

In the particular embodiment of FIGS. 2a to 3b, the switching device comprises two subsets, called E1 and E2, of DC lines each comprising two DC lines 15, 16 and 17, 18. However, at least one of the subsets could as a variant comprise a single DC line or more than two DC lines.

The central terminals of the electrodes of the lines of the two subsets E1 and E2 are placed on concentric circles C1 and C2 of different diameters D1 and D2 (D2 being larger than D1), the central terminals 153, 163, 173, 183 of the first subset are placed on the first circle C1 and the central terminals 154, 164, 174, 184 of the second subset are placed on the second circle C2.

This particular arrangement of the central terminals on concentric circles of various diameters allows the direction of the adjustment of the focus required to bring the focal plane and the active zone ZA closer together to be determined automatically and rapidly, solely on the basis of the resistance measurements (or measurements of other electrical properties) of the DC lines, for any initial diameter of the interaction zone ZI such that the optical control beam FO illuminates the separation zone.

Advantageously, the central terminals 153, 154, 163, 164, 173, 174, 183 and 184 of the DC lines are placed at distances from the centre O, considered in a plane perpendicular to the plane of the active zone ZA, larger than the distances separating the terminals 11a and 12a of the tracks 11 and 12 that bound the active zone ZA. In other words, the central terminals 153, 154, 163, 164, 173, 174, 183 and 184 are located outside the active zone ZA. This allows disruption of the transmission line by the DC lines and vice versa to be limited.

Preferably, the central terminals 153, 154, 163, 164, 173, 174, 183 and 184 of the electrodes of the DC lines 15 to 17 are placed at distances from the centre O, considered in a plane perpendicular to the active zone, larger than the optimal radius RO of the interaction zone ZI when the interaction zone ZI is centred on the centre O and is focused on the active zone ZA. This also allows disruption of the transmission line by the DC lines or of the DC lines by the transmission line to be limited. Thus, the disruptions of the microwave line and of the operation of the switching device in its switching function are limited.

When initially the diameter D of the interaction zone is larger than D1 and D2, the interaction zone ZI being substantially centred in x and z, then R1, R2, R3 and R4 are of the same order of magnitude, i.e. lower than or equal to the conduction threshold, and it is possible to detect that the direction of adjustment of the focus is the direction of defocus of the beam (the focal plane is getting further from the plane of the active zone), when at least one of the following defocus conditions is met: the resistances increase while remaining of the same order of magnitude, i.e. lower than or equal to the conduction threshold, because of the decrease in the luminous density illuminating the separation zone 160 when the size of the interaction zone ZI increases, and/or, in the co-planar configuration, the resistances decrease down to a substantially zero value when the diameter D of the interaction zone ZI increases to the point that the optical beam FO illuminates the ground planes and short-circuits the DC lines. When a defocus condition is met, the direction of adjustment of the focus is then advantageously reversed.

If initially D is comprised between D1 and D2, the interaction zone ZI being substantially centred in x and z, then R3 and R4 are higher than the isolation threshold and R1 and R2 are lower than or equal to the conduction threshold. In other words, R3 and R4 are very much higher than R1 and R2. In this configuration, it is possible to detect that the direction of adjustment of the focus of the beam is that of a defocus when at least one of the following defocus conditions is met: R1 and R2 decrease or R3 and R4 become lower than the conduction threshold (D is then larger than D1 and larger than or equal to D2) or the ratio of R1 or R2 to R3 or R4 becomes lower than a preset threshold ratio. In contrast, if R1 and R2 increase, the direction of the adjustment of the focus is that of a focus (the focal plane is getting closer to the plane of the active zone). R1 and R2 will increase to reach the isolation threshold when D becomes smaller than D1 and to reach a non-illumination threshold when the separation zone 160 is no longer illuminated. The radius of the interaction zone ZI is then the optimal radius RO of the interaction zone ZI.

If initially the interaction zone ZI is substantially centred in x and z, and D is smaller than D1, then the resistances R1, R2, R3 and R4 are higher than the isolation threshold, this making it possible to know that the transmission coefficient of the microwave line is close to its maximum and therefore that the active zone is close to being focused upon. The direction of focus of the beam may be obtained by measuring the transmission coefficient of the transmission line 10 of the switching device during a movement of the lensed optical fibre 21 along the y-axis, or the variation in this coefficient. The direction of movement is that in which the transmission coefficient increases toward a maximum. Focus is for example detected when the transmission coefficient is maximum. The adjustment of the focus is for example stopped when this focus condition is met. The microwave signal may be the useful microwave signal intended to be transmitted over the microwave line, for example the signal intended to be sampled, or a calibration microwave signal superposed on the useful signal and separable from the useful signal. To this end, it is for example formed in one or more separable frequencies of the spectrum of the useful signal.

As a variant, the focus condition is met when the resistances R1 and R2 reach a preset non-illumination threshold.

Moreover, the correct direction of movement of the lensed optical fibre along the x-axis is easily defined when D is comprised between D1 and D2. Specifically, if the interaction zone ZI is initially centred in x, by moving the interaction zone ZI to the right along the x-axis, R1 and R2 increase rapidly to the isolation threshold whereas R3 and R4 remain higher than the isolation threshold. If the beam continues to move from this position along x, R1 and R2 remain higher than the isolation threshold. When the interaction zone ZI is initially very off-centre in x, when the beam is moved in the direction of centrality in x, R1 to R4 first remain substantially constant and higher than the isolation threshold. Next, R1 and R2 rapidly decrease down to the conduction threshold when the interaction zone ZI covers the central terminals of the lines 16 and 17, then R3 and R4 rapidly decrease down to the conduction threshold when the interaction zone ZI covers the central terminals of the lines 18 and 19.

In the particular embodiment of FIGS. 2a to 3b, each of the two subsets E1 and E2 of DC lines comprises two DC lines 15 and 16 for E1 and 17 and 18 for E2. The central terminals of the electrodes of the two respective DC lines of a given subset are placed on two respective sides of a given plane P' that is perpendicular to the plane P and to the active zone ZA and that passes through O. In other words, the central terminals 163 and 164 of the electrodes of the line 16 are placed on the other side of the plane P' with respect to the central terminals 153 and 154 of the electrodes of the line 15. The same goes for the terminals of the lines 17 and 18. Generally, at least one of the subsets advantageously comprises two DC lines arranged in this way. This arrangement allows the position of the interaction zone ZI to be adjusted along the z-axis on the basis of measurements of the resistances R1 and R2 and/or R3 and R4, for example by comparing the measurements of R1 and R2 and/or variations in R1 and R2 and/or measurements of R3 and R4 and/or variations in R3 and R4.

Advantageously, the central terminals of the electrodes of the two lines of the same subset are placed symmetrically to each other with respect to the plane P'. Thus, the resistances of the two lines of the given subset are substantially equal when the diameter D of the interaction zone ZI is larger than or equal to D1 and is centred in z. Thus, in the embodiment of the figures, R1=R2 when the interaction zone ZI is centred in z and covers the central terminals of the lines 15 and 16 and R3=R4 when the interaction zone ZI is centred in z and covers the central terminals of the lines 17 and 18. The presence of the two subsets allows a double verification of the centrality in z to be obtained. The condition of centrality in z may be R1=R2 and/or R3=R4.

When the interaction zone ZI is moved off-centre in z upwards, with D larger than D1, and the interaction zone ZI is centred in x, then R2 and R4 exceed the isolation threshold and R1 remains lower than or equal to the conduction threshold up to a certain point of off-centredness, before rapidly increasing significantly if the off-centredness in z exceeds the threshold. If D is larger than D2, then R4 undergoes the same variation as R2 and increases rapidly after R2.

The presence of two lines in a given subset allows a double verification of the adjustment of the centrality of the interaction zone in x to be obtained.

Provision may be made for at least one DC line of a first type, one of the central terminals of which is placed on one side of the separation plane P and the other terminal of which is placed on the other side of the separation plane P, the two central terminals being placed on an alignment straight line perpendicular to the separation plane P, and for at least one DC line of a second type, one of the central terminals of which is placed on one side of the plane P' and the other of which is placed on the other side of the plane P' (P' is then the separation plane for this line of the second type), the two terminals being placed on a straight line perpendicular to P'. This arrangement allows the position of the interaction zone ZI along the x- and z-axes to be controlled. The device may comprise two DC lines of the second type, the central terminals of one of the lines of the second type being placed on one side of the plane P, and the central terminals of the other line of the second type being placed on the other side of the plane P. Advantageously, but not necessarily, the terminals of these two lines are placed symmetrically with respect to the plane P. As a variant, the terminals of a DC line of the second type are placed on the plane P; in other words, they are radially opposite. Each of these DC lines of the second type may belong to the same subset as a DC line of the first type or to another subset.

FIG. 3b schematically shows a cross-section of the switch of FIG. 3a along the axis BB'. As may be seen in this figure, the electrodes 171, 172 are deposited on the substrate 13, 14 and more particularly on the layer 14.

Advantageously, the active zone ZA and the separation zone 160 are made from different materials. This configuration makes it possible to limit, via an isolation of the photogenerated carriers to the two zones, disruptions caused to the measurement and transmission lines by each other. The position adjustment may be carried out when the switching device is in operation, i.e. during its use as a switch. To this end, in the nonlimiting embodiment of the figures, the electrodes of the DC lines are placed on the first layer 13 of the substrate, as may be seen in FIG. 3b, whereas the conductive tracks of the microwave line 10 are placed on the second layer 14, as may be seen in FIG. 2*b*.

Advantageously, the carriers of the active zone ZA have a shorter lifetime than the carriers of the separation zone 160. This feature allows a more precise measurement of the resistance of the separation zone 160 to be obtained than if the separation zone has carriers of shorter lifetime, while obtaining a good transmission coefficient on the microwave line.

The invention also relates to a process for fabricating the switching device according to the invention, comprising a step of fabricating the switch according to the invention, comprising the step of forming the conductive tracks so that they are separated by the gap, assuring an electrical isolation between the tracks, and so as to bound the active zone, and the step of placing the electrodes of at least one DC line on the substrate so that they are distant from each other, connected by the separation zone and separated by a separation plane P passing through the centre O and perpendicular to the active zone ZA. In other words, the first central terminal of a DC line is placed on one side of the separation plane P and the second terminal of the same line is placed on the other side of the separation plane P of this line. The electrodes and conductive tracks are formed on a substrate.

This process advantageously comprises the following steps shown in FIGS. 4*a* to 4*c*:

providing 100 the first layer 13 of the substrate SUB (FIG. 3*a*), placing 200 the electrodes of at least one DC line on the first layer of the substrate 13 so that they are connected by a zone of the first layer 13 forming the separation zone (FIG. 4*b* seen from above and in cross section along BB'), placing 300 the second layer 14 of the substrate on the first substrate 13, the second layer 14 comprising a continuous first layer CO1 comprising zones intended to receive the conductive tracks 11 and 12 that are connected by a zone intended to form the active zone ZA (FIG. 4*c* seen from above and seen in cross section along CC'), placing 400 the conductive tracks 11 and 12 on the zones intended to receive the conductive tracks so as to obtain the switch shown in FIGS. 2*a* to 3*b*.

The step 300 of forming the second layer 14 comprises, in the coplanar example of FIG. 4*c*, a step of forming two other strips BB1 and BB2 that are intended to receive the conductive strips. The method then comprises a step of forming, on these strips, conductive strips B1 and B2 that are intended to form the ground planes.

The step 200 of placing the electrodes may be preceded by a step of locally etching the photosensitive material that spatially predefines the optimal circular position of the optimally sized interaction zone and optionally the optimal position of the electrodes. In the example of the figures, the photosensitive material is the material of the layer 13.

The second layer 14 is advantageously formed after zones of the electrodes of the DC lines have been masked without masking the zones intended to receive the second layer 14.

The two conductive strips of the continuous layer preferably have substantially the same thickness.

Figure 5:
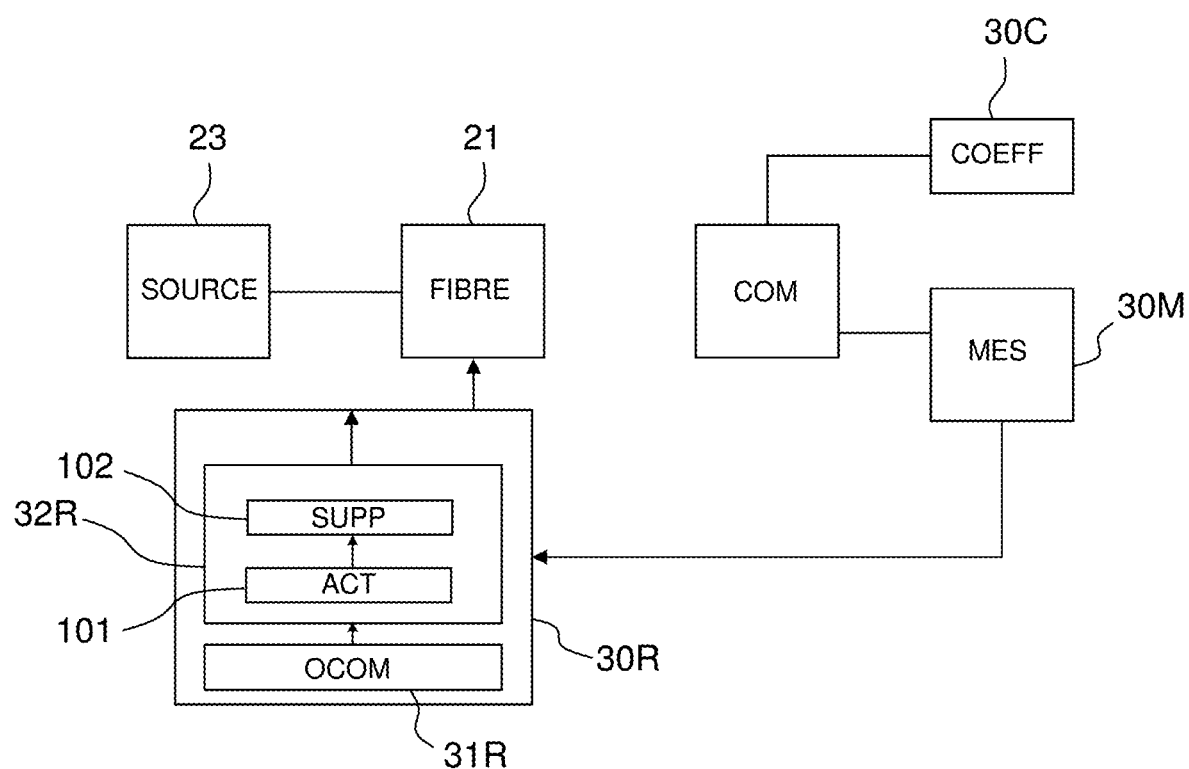
FIG. 5 schematically illustrates elements of the switching device according to the invention.

In FIG. 5, the elements of the switching device according to the invention have been schematically shown.

The switching device comprises adjusting means 30R allowing the position of the interaction zone ZI to be adjusted with respect to the active zone, in the plane of the active zone ZA, at least in the x-direction, and preferably in the y-direction, and/or the diameter of the interaction zone ZI, i.e. the focus of the optical control beam, to be adjusted on the basis of at least one measurement MES, 30M of the value of an electrical property delivered by measuring means or on the basis of a plurality of measurements of at least one electrical property delivered by the measuring means. This allows the adjustment of the focus of the optical beam on the active zone ZA and/or the alignment of the interaction zone ZI with respect to the active zone ZA, in the plane of the active zone, to be at least partially automated.

The adjusting device 30R may also use, for these adjustments, measurements of a transmission coefficient of a microwave signal delivered by means 30C for measuring the transmission coefficient of a microwave signal, for example a calibration microwave signal, guided by the microwave line through the switch, as shown in FIG. 5. These means may for example comprise means for measuring the power of the calibration microwave signal input into and output from the switch.

Figure 6A:
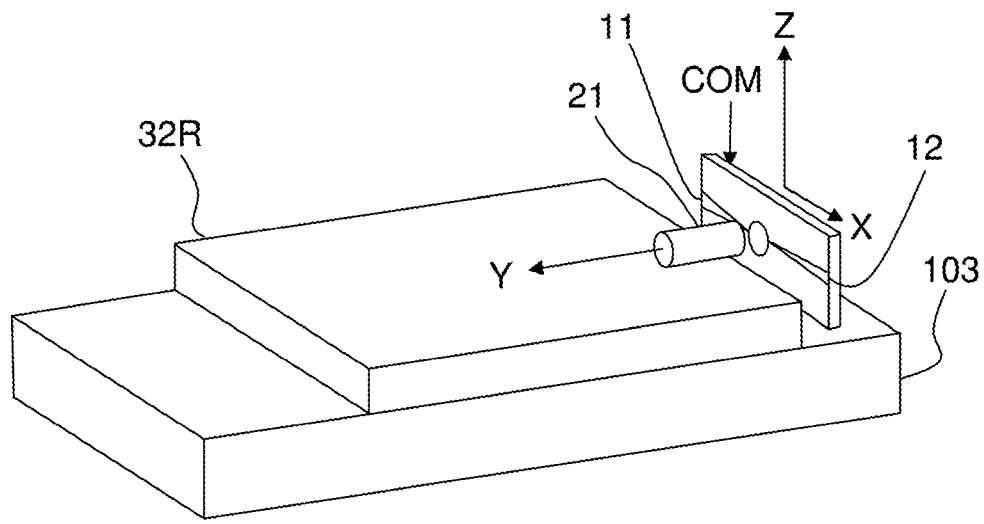
FIGS. 6a and 6b schematically illustrate in perspective (FIG. 6a) and seen from the side (FIG. 6b) the switching device according to the invention.
Figure 6B:
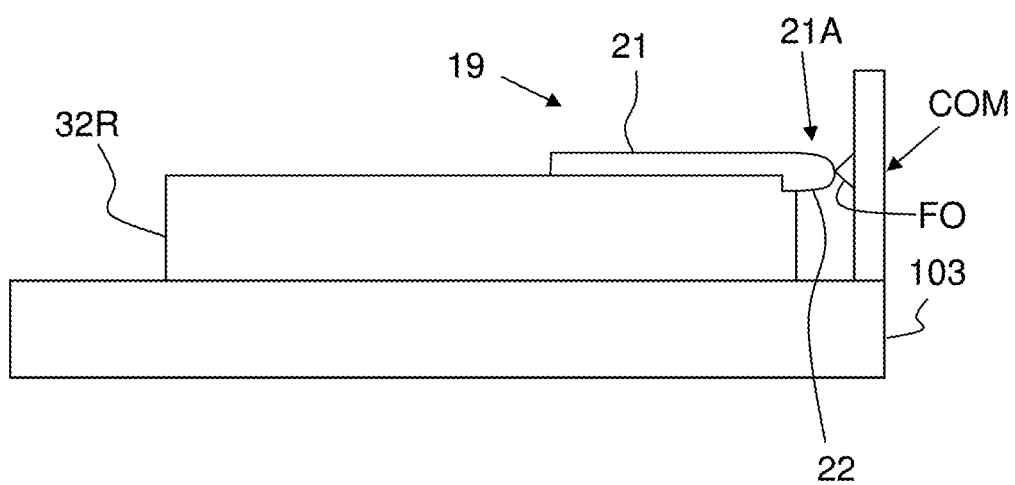
Figure 7:
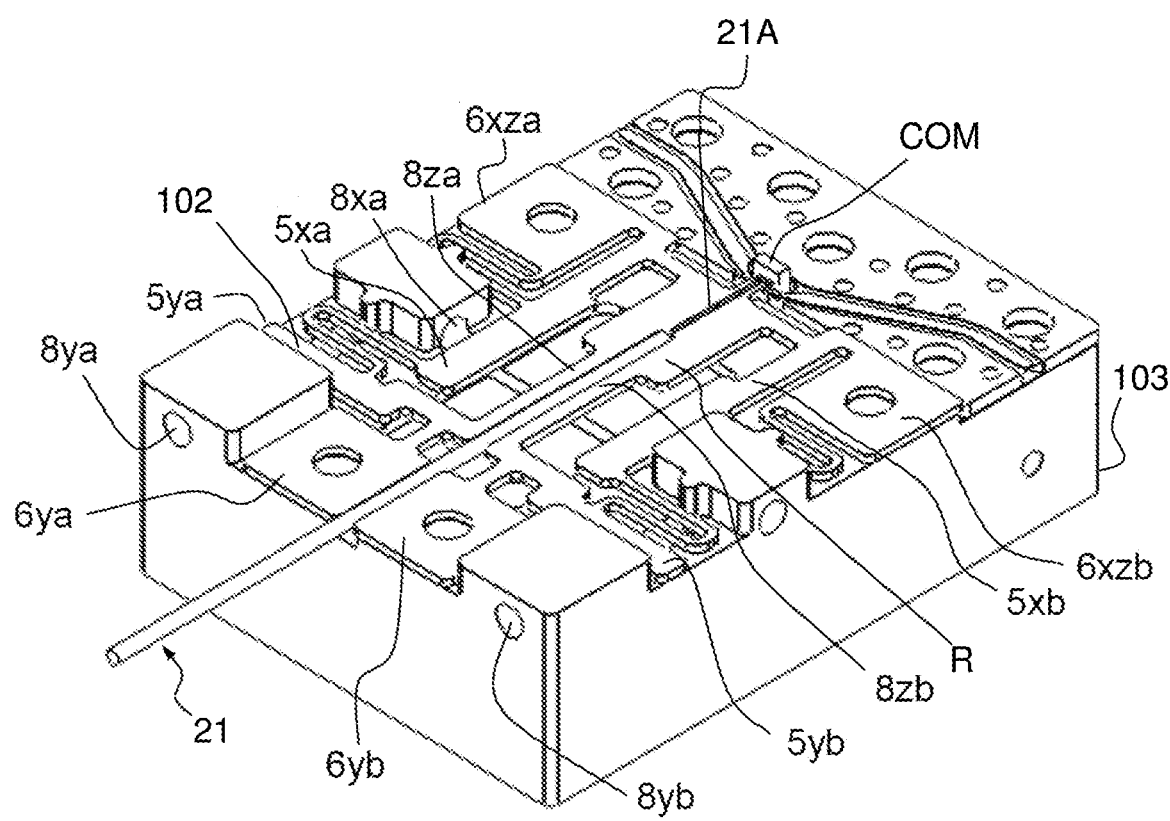
FIG. 7 schematically illustrates in perspective the intermediate carrier fastened to a fixed carrier.
Figure 8:
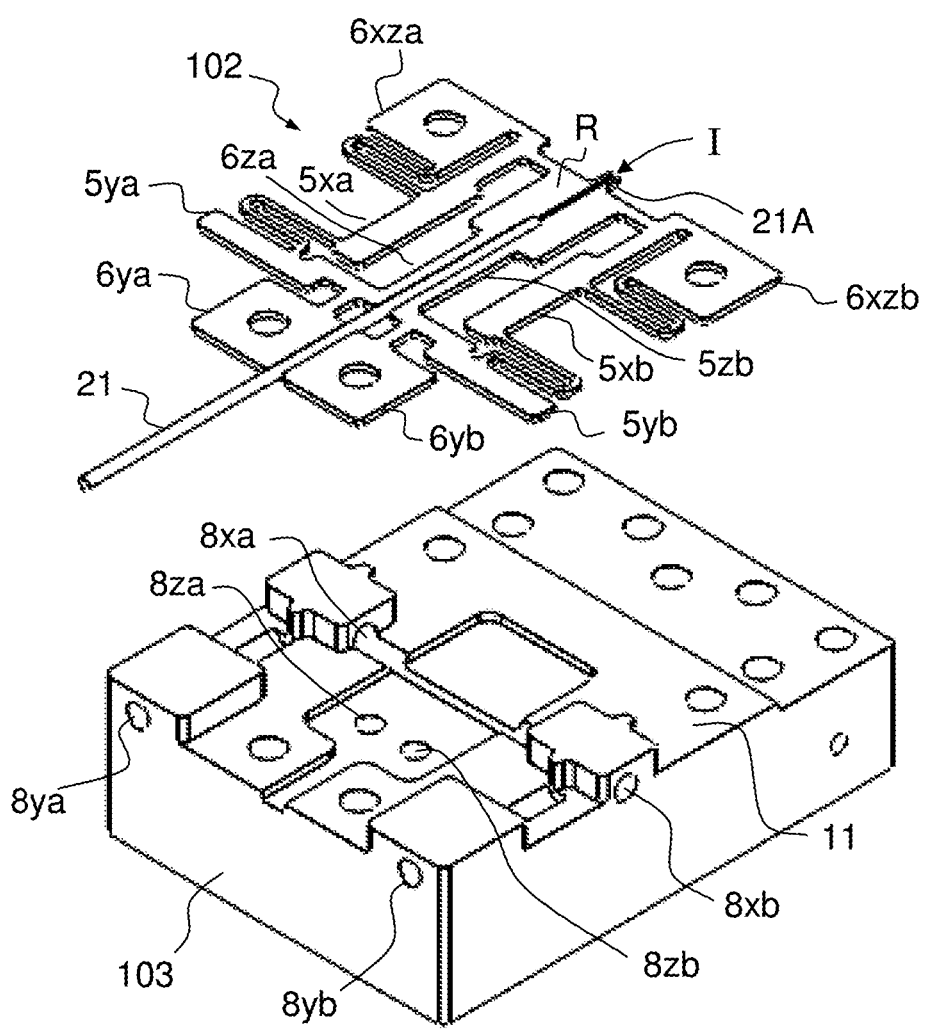
FIG. 8 schematically illustrates an exploded view of the intermediate carrier and the fixed carrier.

FIGS. 6*a* and 6*b* schematically show two views of a portion of the switching device according to the invention. The DC lines are not shown for greater clarity. The switching device comprises the switch COM and conveying means 19 allowing the optical control beam FO to be confined and conveyed to the active zone ZA. The conveying means 19 comprise at least one optical component through which the optical beam passes between the source 23, shown in FIG. 5, of the beam and the interaction zone ZI. The conveying means 19 for example comprise an optical fibre 21 allowing the optical control beam to be guided and/or a focusing lens 22 allowing the beam to be focused. These conveying means 19 allow the size of the interaction zone ZI to be limited. As a variant, the switching device is devoid of conveying means. In the nonlimiting example of the figures, the conveying means comprise a lensed optical fibre comprising an optical fibre 21 equipped with a focusing lens 22 that is fastened to one end of the optical fibre 21. The invention is described with reference to this example but applies to any type of conveying means.

By moving an optical component or a part of an optical component of the conveying means 19 and/or the source 23 with respect to the active zone ZA or with respect to the centre O, the interaction zone ZI is moved with respect to the active zone ZA or with respect to the centre O in the plane of the active zone ZA and/or the diameter of the interaction zone ZI is modified. The adjusting means therefore advantageously allow the position of at least one optical component or of a part of at least one optical component of the conveying means 19 and/or the source 23 to be adjusted with respect to the active zone ZA so as to adjust the focus of the optical beam with respect to the plane of the active zone and/or the position of the interaction zone ZI in the plane of the active zone ZA.

In the nonlimiting embodiment of FIGS. 6*a* and 6*b*, the lensed optical fibre 21 is an optical fibre equipped with a focusing lens 22 that is securely fastened to one end 21A of the optical fibre 21. By moving this end 21A of the optical fibre closer to/further away from the active zone ZA along the y-axis, the diameter of the interaction zone ZI increases/decreases, respectively. By moving this end along the x-axis, along the z-axis, respectively, the interaction zone ZI is moved with respect to the active zone ZA or with respect to the centre O, along the x-axis, along the z-axis, respectively.

The proposed solution allows, by virtue of the adjusting means, adjustments of alignment and of focus to be carried out throughout the lifetime of the switching device, this being advantageous when the switching device is subjected to vibrations that may induce relative movements between the end 21A of the lensed optical fibre 19 and the active zone ZA, because it makes it possible to limit transmission-line transmission losses and to avoid having to make the beam output from the fibre highly divergent to assure the active zone ZA is illuminated or having to use powerful lasers that are quite difficult to control at high frequencies with a good power contrast. The proposed solution therefore makes it possible to envisage decreasing the optical power to be delivered to the optical fibre.

Advantageously, the adjusting means 30R are configured so as to allow the adjustments to be carried out when the switching device is in its operational configuration, i.e. during its use as a switch.

Advantageously, the adjusting means 30R allow the relative position of the source 23 and/or of at least one part of at least one optical component of the conveying means (the end 21A in the example of the figures) to be independently adjusted along a plurality of orthogonal axes.

The adjusting means 30R comprise a control unit OCOM, 31R configured to generate a relative control movement on the basis of at least one measurement of an electrical property taken by the measuring means or on the basis of a plurality of measurements of an electrical property taken, by the measuring means, in a plurality of relative positions between the active zone ZA and the source 23 and/or of at least one part of at least one optical component of the conveying means (the end 21A in the example of the figures) with respect to the active zone in at least one direction.

The adjusting means 30R also comprise an actuating device 32R comprising at least one actuator allowing the source 23 and/or at least one part of an optical component of the conveying means (the end 21A in the example of the figures) to be moved with respect to the active zone ZA, in at least one direction (at least the x- or y-direction), but preferably in three directions, on reception of the relative control movement. The actuating device is advantageously configured to move the source 23 and/or at least one part of at least one optical component of the conveying means with respect to the active zone, with the relative control movement generated by the control unit and received by the actuating device. The one or more actuators are preferably electrically controlled so as to allow an automatic adjustment to be carried out. As a variant or in addition, the actuators are manually controlled.

Advantageously, the actuating device 32R is fastened to the switch COM.

As may be seen in FIG. 5, the actuating device 32R for example comprises a deformable intermediate carrier 102 and a set 101 of at least one actuator.

The deformable intermediate carrier 102 is more precisely shown in FIGS. 7 to 10.

The intermediate carrier comprises a receptacle R that receives the optical fibre 21 and that comprises a zone of interest I that is securely fastened to the end of the lensed optical fibre (or any element to be moved with respect to the active zone for the adjustments). The receptacle R for example comprises a trough SI that receives the end of the optical fibre and that is configured to hold the end of the optical fibre stationary with respect to itself. The deformable intermediate carrier 102 is placed on a common carrier 103 on which the switch COM is also placed. The optical fibre 21 is placed on the intermediate carrier.

The actuating device comprises actuators 8xa, 8xb, 8ya, 8yb, 8za, 8zb configured to deform the carrier, preferably elastically, so as to move the noteworthy zone I with respect to the active zone ZA, so as to move the end of the optical fibre with respect to this active zone.

Advantageously, the deformable intermediate carrier 102 is of unitary construction 2. By intermediate carrier of unitary construction, what is meant is a carrier consisting of a single part or of a plurality of parts that are securely assembled with one another. A carrier of unitary construction may be formed by composite assembly of different materials.

The intermediate carrier 2 comprises anchoring zones 6xza, 6xzb; 6ya, 6yb; 6xza, 6xzb that are fixed with respect to the active zone.

The adjusting device comprises a plurality of adjusting subsets intended to adjust the position of the noteworthy zone I with respect to the active zone ZA. Each adjusting subset comprises, for example, two levers 5xa, 5xb, 5ya, 5yb; 5za, 5zb formed in the intermediate carrier 2 and each being connected to one of the fixed anchoring zones 6xza, 6xzb; 6ya, 6yb; 6xza, 6xzb (by means of a supple hinge zone 7xza, 7xzb; 7ya, 7yb; 7xza, 7xzb) and at least one actuator 8xa, 8xb, 8ya, 8yb; 8za, 8zb intended to exert a force Fxa, Fxb; Fya, Fyb; Fza, Fzb (FIGS. 9 and 10) on a first zone Z1xa, Z1xb, Z1ya, Z1yb, Z1za, Z1zb of each arm of the levers 5xa, 5xb, 5ya, 5yb, 5za, 5zb with a first lever arm b1xa, b1xb, b1ya, b1yb, b1za, b1zb measured along said lever 5xa, 5xb, 5ya, 5yb; 5za, 5zb with respect to said supple hinge zone 7xza, 7xzb; 7ya, 7yb; 7xza, 7xzb, said force Fxa, Fxb; Fya, Fyb; Fza, Fzb allowing the lever 5xa, 5xb, 5ya, 5yb; 5za, 5zb to be made to pivot with respect to said anchoring zone 6xza, 6xzb; 6ya, 6yb; 6xza, 6xzb about the supple hinge zone 7xza, 7xzb; 7ya, 7yb; 7xza, 7xzb, said noteworthy zone I of the receptacle 3 being connected to a second zone Z2xa, Z2xb, Z2ya, Z2yb; 30 of the lever with a second lever arm b2xza, b2xzb; b2ya, b2yb; b2xza, b2xzb (FIG. 10) measured along said lever 5xa, 5xb, 5ya, 5yb; 5za, 5zb with respect to said supple hinge zone 7xza, 7xzb; 7ya, 7yb; 7xza, 7xzb, said second lever arm being shorter than the first lever arm b1xa, b1xb, b1ya, b1yb, b1za, b1zb so that the lever 6xza, 6xzb; 6ya, 6yb; 6xza, 6xzb assures, under the effect of the force Fxa, Fxb; Fya, Fyb; Fza, Fzb, a transmission, to the noteworthy zone 30, of a movement of the first zone Z1xa, Z1xb, Z1ya, Z1yb, Z1za, Z1zb of the lever 5xa, 5xb, 5ya, 5yb, 5za, 5zb depending on the x, y, z adjustment, said movement of the first zone of the lever Z1xa, Z1xb, Z1ya, Z1yb, Z1za, Z1zb being transmitted, in a reduced way, to the noteworthy zone I. In the embodiment of the figures, the noteworthy zone I corresponds to an end of the levers 5za et 5zb.

The adjusting device allows the position of the noteworthy zone with respect to the active zone to be independently adjusted in three respective orthogonal adjustment directions x, y and z by means of respective adjustment subsets. The respective forces Fxa, Fxb; Fya, Fyb; Fza, Fzb in the respective directions x, y and z cause translations of the respective first zones Z1xa, Z1xb, Z1ya, Z1yb, Z1za, Z1zb of the respective levers 5xa, 5xb, 5ya, 5yb, 5za, 5zb in respective adjustment directions x, y and z.

The intermediate carrier 2 is shown at rest in the figures. Under the effect of forces Fxa and Fxb substantially parallel to the x-direction, the supple hinge zones 7xza and 7xzb connecting the respective levers 5xa and 5xb to the respective anchoring zones 6xa and 6xb deform causing these levers 5xa, 5xb to pivot with respect to the respective anchoring zones 6xa and 6xb about respective supple hinge zones 7xza, 7xzb, this substantially corresponding to a pivoting of the first levers 5xa and 5xb about respective axes Zxa and Zxb (placed approximately in the figures) with respect to the carrier 1.

Arrows f1xa, f1xb, f1y and f1z show the directions and signs of the vectors of the main movements of the noteworthy zone I engendered by the respective forces Fxa, Fxb; Fya, Fyb; Fza Fzb applied to the respective levers 5xa, 5xb, 5ya, 5yb; 5za, 5zb. The levers 5xa and 5xb extend longitudinally, at rest, parallel to the y-axis. The respective actuators associated with the respective levers 5xa and 5xb are configured to exert, on these respective levers 5xa, 5xb, respective forces Fxa and Fxb that are substantially parallel to x and that generate movements of the first zones Z1xa, Z1xb of the levers. These movements are substantially translational movements along the x-axis.

The carrier is configured so that the movement of the first zone of the lever along the x-direction is transmitted to the noteworthy zone 30. To this end, the levers 5xa, 5xb are connected to the receptacle 2 with the two respective lever arms b2xa, b2xb by means of respective force members 9xa, 9xb. Therefore, when the zone Z1xa, Z1xb of a lever 5xa, 5xb is moved with a translational movement along x under the effect of the force Fxa, Fxb, the noteworthy zone 30 is moved with a translational movement along x in the direction shown by the arrows flxa, flxb. The ratios between the movements of the noteworthy zone 30 and those of the zones Z1xa, Z1xb are equal to the ratios between the respective first lever arms b1xa and b1xb and the respective second lever arms b2xa and b2xb in the case where the levers do not deform under the effect of the respective forces Fxa, Fxb. In other words, the main movement of the first zone Z1xa, Z1xb of a first lever 5xa, 5xb is transmitted, in a reduced way, to the noteworthy zone I via a lever effect. The principle of adjustment of the movement is the same for each adjustment subset and will not be described again.

The absence of play allows the end of the fibre to be positioned in the space neighbouring the active zone with a precision better than or equal to 1 μm, thereby allowing almost all of the light energy of the optical beam emitted by the fibre to be directed onto the photo-switch, giving it with an excellent performance in terms of contrast while avoiding the use of powerful laser sources. Thus, the device according to the invention allows a high-efficiency radiofrequency (RF) sampling device to be produced without notably degrading the input signal. Thus, a frequencymeter based on Fourier analysis is achievable, not only in amplitude but also in phase, allowing functions for measuring the direction of arrival of a wave to be combined with functions for characterizing a signal in the frequency and time domain. The absence of play also ensures a very good control of the position. The reduction ratio allows a precision better than one micron to be obtained with a less precise and therefore less expensive actuator, for example a micron-sized screw.

This device allows a reversible adjustment to be carried out. It is not very bulky and may allow relative position to be adjusted before the device is used or throughout the lifetime of the device. Specifically, it allows one of the objects to be kept in the desired relative position by maintaining, by means of the actuators, suitable forces allowing the desired position of the respective levers to be obtained The levers 5ya, 5yb extend longitudinally along the x-axis at rest and the levers 5za, 5zb extend along the y-axis.

Advantageously, all the levers are coplanar at rest. The intermediate carrier is therefore compact and easy to produce. Advantageously, the intermediate carrier 102 is substantially planar at rest.

Advantageously, the levers associated with the various main adjustment directions are separate in order to ensure a decoupling of the adjustment in the three orthogonal directions.

The respective actuators 8xa, 8xb, 8ya, 8yb; 8za, 8zb may each comprise an element intended to bear against a lever so as to apply the force to said lever. The element may be a piezoelectric actuator or a screw, for example a set screw, of the type with a pitch smaller than 1 mm or at least equal to 1 millimetre, lying facing the respective levers and intended to bear against the respective levers so as to apply the respective forces to these levers. As a variant, the actuators are of the type allowing the respective forces to be applied to the respective levers at distance. Such an actuator for example comprises an electrical control device allowing a variable voltage to be applied across the terminals of a coil producing a variable magnetic field the effect of the variation of which moves the first zone of the corresponding lever.

Advantageously, at least one lever, and preferably all the levers, are designed to elastically deform in a flexural way under the effect of the corresponding force (Fxa), this contributing to the reduction of the movement between the first zone of the lever and the noteworthy zone. The mechanical reduction obtained via the lever effect is thus increased by the elastic deformation of the lever itself under the effect of the force because the lever opposes the pivoting to some extent.

As a variant, at least one lever is rigid in the sense that it does not deform under the effect of the forces.

In the nonlimiting embodiment of the figures, the adjusting device comprises six adjusting subsets that are intended to adjust the position of the noteworthy zone I in three main orthogonal adjustment directions x, y and z, i.e. two subsets per main adjustment direction. As a variant, the number of adjusting subsets is different from 6 and/or the number of levers per subset is different.

Figure 9:
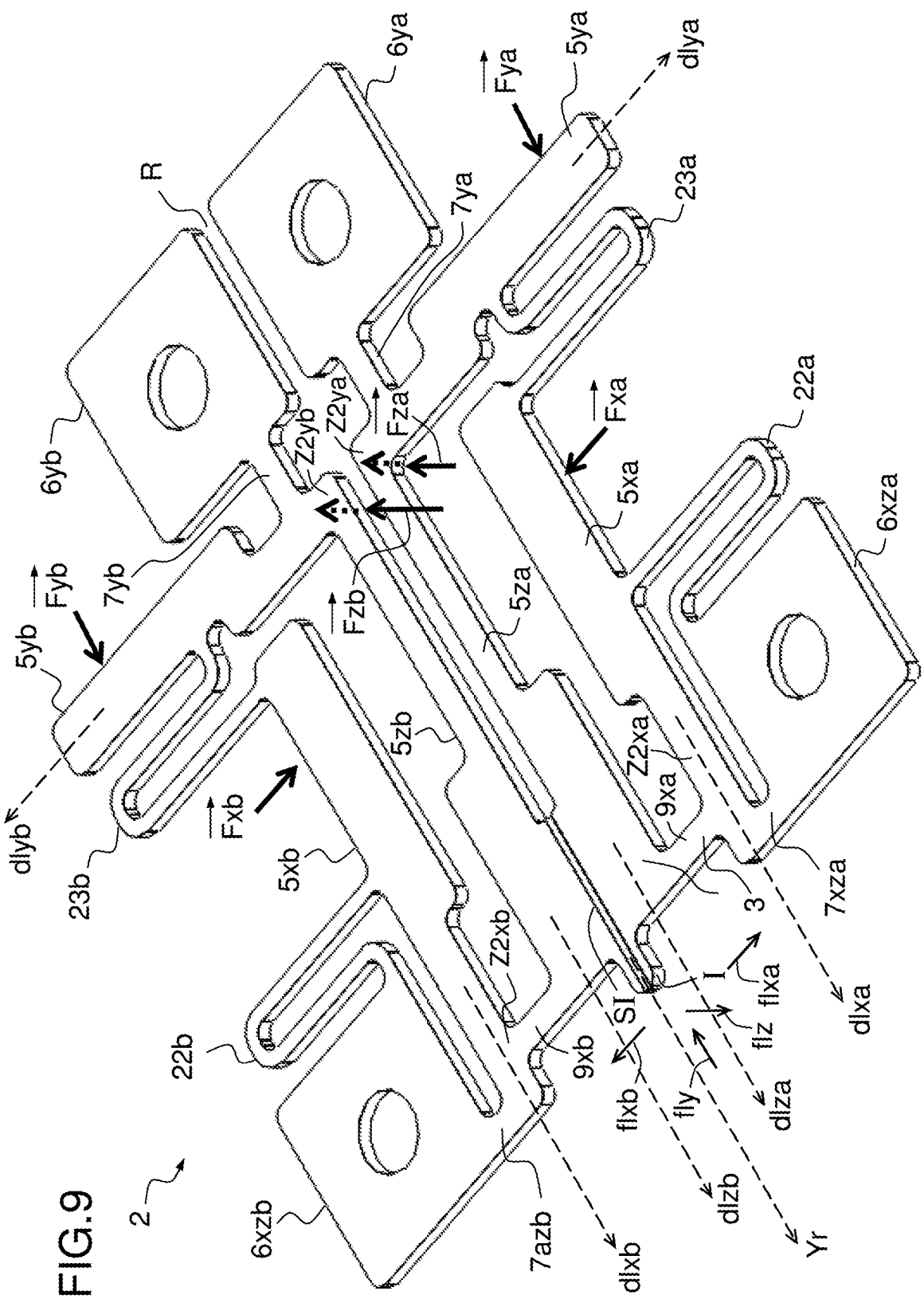
FIGS. 9 and 10 schematically illustrate the intermediate carrier.
Figure 10:
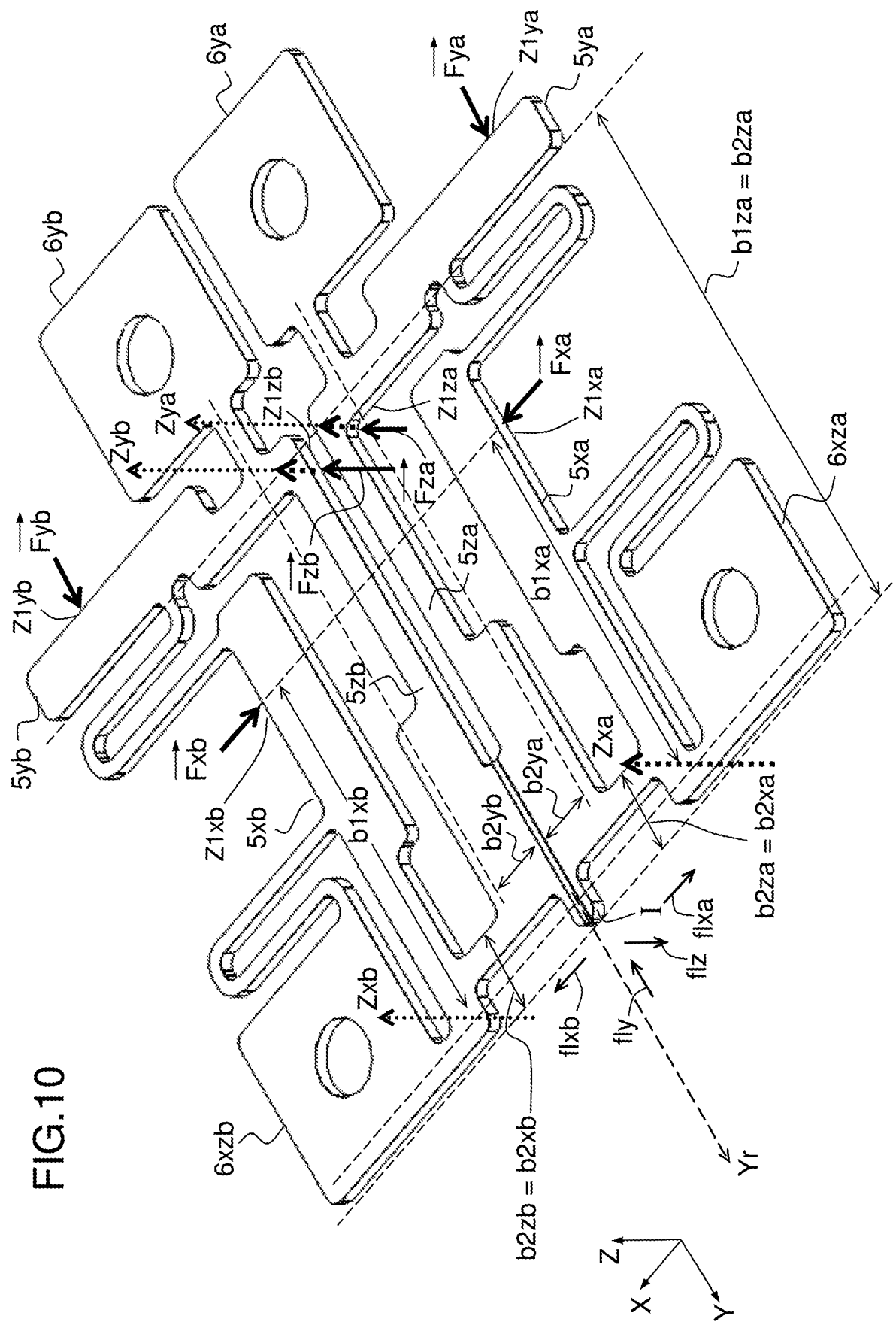

The receptacle R comprises holding elements 22a, 22b, 23a, 23b, referenced in FIG. 9, allowing each lever to be held in a rest position when the forces are zero. These means comprise, in the embodiment of the figures, first spring elements 22a, 22b connecting the first anchoring zones 6xza, 6xzb and the respective first levers 5xa, 5xb and second spring elements 23a, 23b connecting the first levers 5xa, 5xb and the respective second levers 5ya, 5yb. The holding elements have a stiffness lower than the stiffness of the supple hinged zones 7xza, 7xzb connecting the corresponding levers (here the first levers 5xa, 5xb) and the corresponding anchoring zones 6xza, 6xzb.

As may be seen in FIG. 6a, the two tracks 11 and 12 of the transmission line are aligned and extend longitudinally along the x-axis parallel to the straight lines on which the terminals of the various DC lines are placed.

Advantageously, the intermediate carrier 102 and a planar face of the switch perpendicular to the active zone ZA are placed on a given planar face or parallel planar faces of the common carrier, this allowing the adjustment of the position of the end of the optical fibre with respect to the active zone to be facilitated.

The invention also relates to a method for aligning the source and/or at least one part of at least one optical component of the conveying means with respect to the active zone so as to obtain a preset position of the zone of interest with respect to the active zone in the plane of the active zone and/or so as to focus the optical beam substantially onto the plane of the active zone, said method comprising the following steps:

measuring the electrical property of the separation zone between the terminals of at least one line for conveying a DC current of said set, adjusting the position of the source and/or of at least one part of at least one optical component of the conveying means relatively to the switching device on the basis of said measurement.

The relative position may also be adjusted on the basis of a transmission-coefficient measurement as described above.

The adjustment is advantageously carried out on the basis of a plurality of measurements of the electrical property, said measurements being obtained in a plurality of known relative positions.

The adjustment may comprise a step of calculating a variation in the electrical property, on the basis of measurements and/or a step of comparing a measurement of the electrical property to a threshold (for example to the conduction or isolation threshold).

In the case where there is a plurality of DC lines, the adjusting step advantageously comprises a step of comparing measurements of the electrical property across the terminals of a plurality of DC lines.

The adjustment may then comprise a step of determining a relative control movement between the source and/or the at least one part of at least one optical component of the conveying means and the active zone on the basis of a result obtained by comparison and/or variation-calculation operations and a step of moving the source and/or the at least one part of at least one optical component of the conveying means relative to the active zone by the relative control movement.

Advantageously, the method comprises a step of adjusting the position of the interaction zone in the plane of the active zone so as to substantially centre the interaction zone ZI on the centre O, followed by a step of adjusting the focus of the optical beam substantially onto the plane of the active zone. This second step may be followed by another step of adjusting the position of the interaction zone in the plane of the active zone so as to substantially centre the interaction zone ZI on the centre O because said first step might have been imprecise if the beam was initially very mis-focused.

The adjusting device is advantageously configured to implement this method.

The control unit may comprise one or more dedicated electronic circuits or a general-use circuit. Each electronic circuit may comprise a reprogrammable computing machine (a processor or a microcontroller for example) and/or a computer that executes a program comprising a sequence of instructions and/or a dedicated computing machine (for example a set of logic gates such as an FPGA, a DSP or an ASIC, or any other hardware module).

The invention claimed is:

1. A switch comprising a semiconductor substrate and a microwave line comprising two conductive tracks produced on the substrate, the two conductive tracks being separated by a gap assuring an electrical isolation between the two conductive tracks, an active zone of the substrate being bounded by the two conductive tracks and connecting the two conductive tracks, the active zone being planar, defining a plane of the active zone, and having a centre O, the substrate being able to be made locally conductive when the active zone is illuminated by an optical control beam so as to establish an electrical contact between the two tracks of the microwave line, wherein the switch further comprises a set of at least one line, called the DC line, intended to convey a DC current, the DC line comprising two electrodes that are distant from each other so that an electrical isolation is assured between the two electrodes, the electrodes being connected by a separation zone of the substrate, the separation zone being able to be made conductive when it is illuminated by the optical control beam so as to establish an electrical contact between the two electrodes, the two electrodes being separated by a separation plane of the DC line, the separation plane passing through the centre O and being perpendicular to the plane of the active zone.

2. The switch according to claim 1, wherein the two electrodes each comprise a terminal called the central terminal of the DC line, the central terminals of the two electrodes of the DC line being placed facing each other on a straight line called the alignment straight line.

3. The switch according to claim 2, wherein the alignment straight line of the DC line is perpendicular to the separation plane of the DC line symmetrically with respect to the separation plane of the DC line.

4. The switch according to claim 1, wherein the set comprises two DC lines the respective alignment straight lines of which are perpendicular to each other.

5. The switch according to claim 2, wherein the set comprises a plurality of DC lines, two DC lines of which have the same separation plane and, the central terminals of each of the two DC lines being placed symmetrically with respect to the separation plane P on an alignment straight line of the DC line perpendicular to the separation plane, the alignment straight lines of the two lines are placed symmetrically with respect to another plane passing through the centre, perpendicular to the plane of the active zone and perpendicular to the separation plane.

6. The switch according to claim 2, wherein the set comprises a first subset of at least one DC line and a second subset of at least one DC line, the central terminals of the electrodes of the DC lines of the first and second subsets being placed on concentric circles the centre of which is located on an axis perpendicular to the plane of the active zone and passing through the centre O.

7. The switch according to claim 1, wherein the separation plane of the DC line of the first subset is the separation plane of the DC line of the second subset, the two central terminals of the DC line of the first subset being placed on the other side of another plane passing through the centre O, perpendicular to the plane of the active zone and perpendicular to the separation plane with respect to the central terminals of the DC line of the second subset.

8. The switch according to claim 2, wherein the alignment straight line of at least one DC line passes through an axis perpendicular to the plane of the active zone and passing through the centre O.

9. The switch according to claim 1, wherein the active zone and the separation zone are made from different materials.

10. The switch according to claim 1, wherein the active zone comprises carriers of lifetime lower than a lifetime of the carriers of the separation zone.

11. A process for fabricating a switch according to claim 1, said process comprising the steps of placing the conductive tracks on the substrate so that they are separated by the gap, and so that they bound and are connected by the active zone, and placing the electrodes of the DC line on the substrate so that they are distant from each other so that an electrical isolation is assured between the two electrodes and so that they are connected by the separation zone of the substrate, and separated by the separation plane.

12. A switching device comprising a switch according to claim 1, comprising a source generating the optical control beam and/or conveying means comprising at least one optical component allowing the optical control beam to be conveyed to the active zone.

13. The switching device according to claim 1, comprising an actuating device allowing a position of the optical source and/or of at least one part of at least one optical component of the conveying means to be modified with respect to the active zone.

14. The switching device according to either claim 1, comprising at least one sensor allowing an electrical property of the separation zone between central terminals of the two electrodes of the DC line to be measured, the adjusting device being able to adjust a position of the optical source and/or of at least one part of at least one optical component of the conveying means with respect to the active zone on the basis of at least one measurement of the electrical property.

15. The switching device according to claim 14, configured to implement an aligning step when a condition of implementation of the aligning step is met, the switching device being configured to implement the following steps during the implementation of the aligning step:
　measuring the electrical property of the separation zone between the central terminals of the DC line by means of the sensor,
　adjusting the position of the source and/or of at least one part of at least one optical component of the conveying means relatively to the active zone on the basis of a measurement of the electrical property issued from the sensor, by means of the adjusting device.

16. A method for aligning the source and/or at least one part of at least one optical component of the conveying means with respect to the active zone of a switching device according to claim 12, said method comprising the following steps:
　measuring the electrical property of the separation zone between the central terminals of the DC line,
　adjusting the position of the source and/or of at least one part of at least one optical component of the conveying means relatively to the active zone on the basis of said measurement.

* * * * *

UNITED STATES PATENT AND TRADEMARK OFFICE
CERTIFICATE OF CORRECTION

PATENT NO. : 10,630,288 B2
APPLICATION NO. : 16/172440
DATED : April 21, 2020
INVENTOR(S) : Yves Canal et al.

Page 1 of 1

It is certified that error appears in the above-identified patent and that said Letters Patent is hereby corrected as shown below:

In the Claims

In Claim 14, Column 21, Line 4, "to either claim 1" should be -- to claim 1 --.

Signed and Sealed this
First Day of December, 2020

Andrei Iancu
*Director of the United States Patent and Trademark Office*